C. SONNEBORN.

RADIATING CASING.

APPLICATION FILED SEPT. 7, 1918.

Reissued Dec. 30, 1919.

14,784.

2 SHEETS—SHEET 1.

WITNESSES

J. Herbert Bradley.

Jo. Baily Brown

INVENTOR

Charles Sonneborn by Fredk W. Winter his Atty

C. SONNEBORN.

RADIATING CASING.

APPLICATION FILED SEPT. 7, 1918.

Reissued Dec. 30, 1919.

14,784.

2 SHEETS—SHEET 2.

WITNESSES

J. Herbert Bradley.

Jo. Baily Brown

INVENTOR

Charles Sonneborn by Fredk W. Winter his atty

UNITED STATES PATENT OFFICE.

CHARLES SONNEBORN, OF WEST PITTSBURGH, PENNSYLVANIA.

RADIATING-CASING.

14,784. Specification of Reissued Letters Patent. Reissued Dec. 30, 1919.

Original No. 1,261,637, dated April 2, 1918, Serial No. 192,518, filed September 21, 1917. Application for reissue filed September 7, 1918. Serial No. 253,115.

*To all whom it may concern:*

Be it known that I, CHARLES SONNEBORN, citizen of the United States, residing at West Pittsburgh, in the county of Lawrence and State of Pennsylvania, have invented certain new and useful Improvements in Radiating-Casings, of which the following is a specification.

My invention consists of an improvement in radiating casings for use with transformers, or other similar vessels adapted to contain liquids, and has in view to provide a casing for such use having a large radiating area for effecting or assisting cooling of the contained or circulating liquid. A common expedient in vessels of this kind is to form the wall of the vessel of sheet metal in corrugated or similar form whereby to provide a series of somewhat closely contiguous liquid-containing portions with intervening air circulation spaces.

My invention has in view to construct such a casing or vessel of a series of previously pressed or formed units or sections, of sheet metal, so made that when the edges of the units are joined, and the entire series is adjusted to the final arrangement providing the inclosed vessel, whether circular in cross section or otherwise, they provide a main liquid-containing chamber with a series of regularly spaced laterally projecting liquid-containing portions and intervening or circulation spaces, as is more fully hereinafter described and claimed.

It will be obvious that the cross sectional construction and arrangement of the main vessel may be of various forms, as square, oblong, oval, circular, etc., and I do not desire to limit my invention to any particular form in cross section, but have illustrated in the drawings a conventional circular shape which is well adapted to the purposes in view.

Referring to the drawings:—

Figure 1:
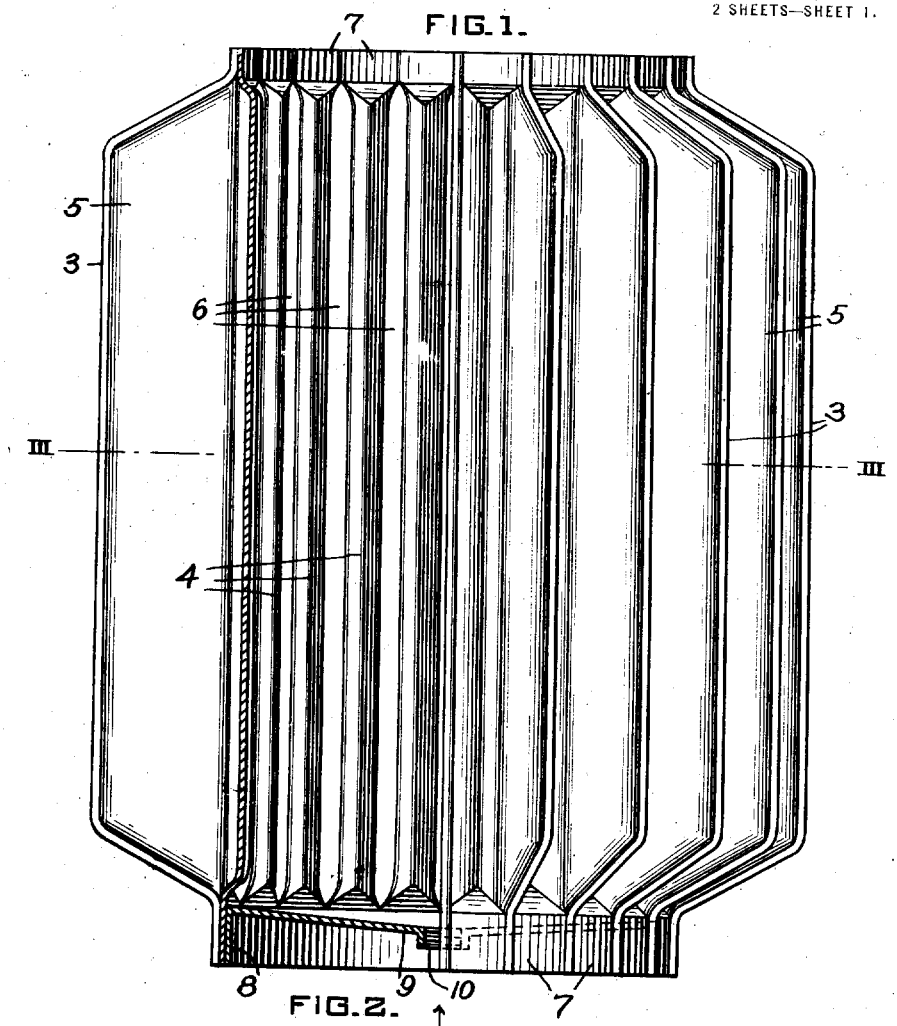
Figure 1 is a view of the complete vessel in elevation partly in section indicated by the line, I—I, of Fig. 2.
Figure 2:
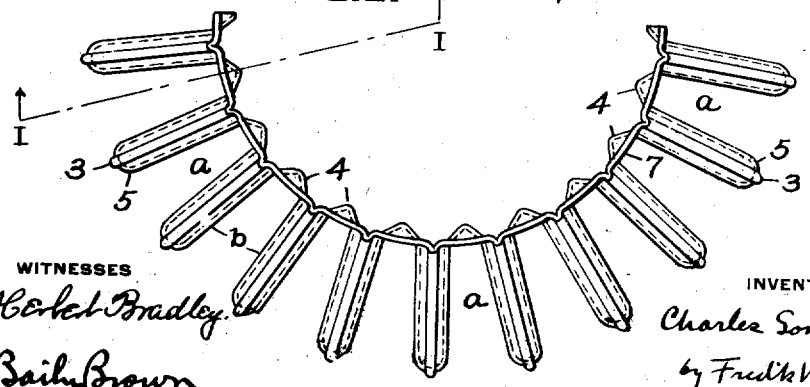
Fig. 2 is a half plan view of the vessel wall.
Figure 3:
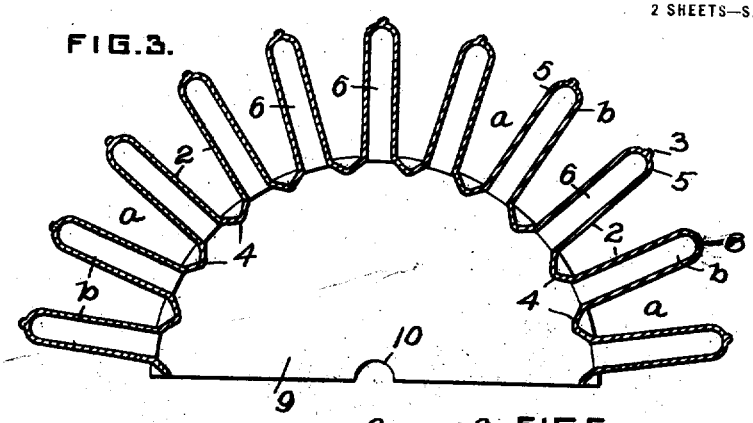
Fig. 3 is a half cross sectional view indicated by the line III—III, of Fig. 1.
Figure 5:
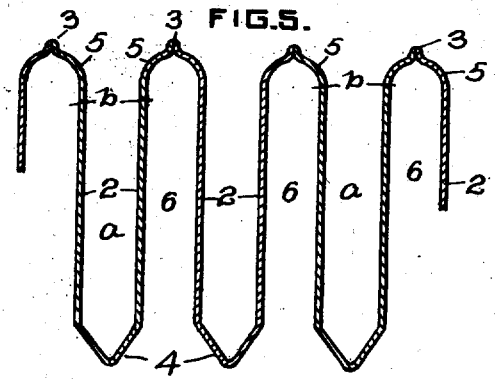
Fig. 5 is an enlarged cross sectional detail view showing a plurality of such units when welded together in continuous formation and prior to adjustment to the cross sectional contour of the complete vessel.
Figure 4:
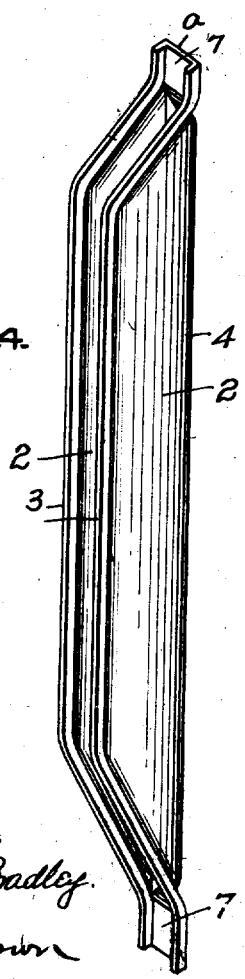
Fig. 4 is a perspective view of one of the pressed sheet metal sections or units, detached.
Figure 6:
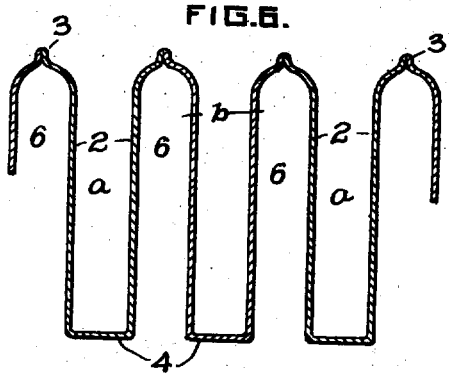
Fig. 6 is a similar view showing a modified construction of the inner portion of the units.

Referring to the drawings, the entire side portion of the vessel or casing is composed of a series of substantially U-shaped units *a*, which, when welded together and assembled as in the construction shown, provide by their sides 2 the laterally projecting liquid-containing radiating members *b*. Each unit *a*, which is of sheet metal, is pressed from a suitably formed blank so as to provide the laterally extending parallel walls 2, 2, each terminating in a connecting edge 3 and having a back 4. Terminal edges 3 are off-set from the main sides 2 as indicated at 5, whereby to provide, when the units are welded together, the intervening liquid-containing or circulating spaces 6. At each end the unit *a* terminates in a flat straight portion 7, which is adapted, when the units are finally connected, to provide terminal annular rims by which the complete side wall of the vessel is joined to the flange 8 of a bottom 9, by the welding process. Bottom 9 preferably slopes toward its center and is provided with a drain connection 10, as will be readily understood.

In the construction of the radiating casing according to my invention, suitable sheet metal blanks are pressed to form the units *a* above described. A plurality of the units *a* are then placed side by side with their terminal edges 3 extending outwardly and in alinement so that they will abut each other, and these several terminal edges 3 are then secured together by welding, thus forming the units into a unitary structure having radiating members *b*.

When a sufficient number of the units *a* have been thus joined, the resultant continuously straight body is pressed or bent to form the surrounding side wall of the receptacle of any desired shape, thereby spreading or enlarging the space between the radiating members *b*, and bringing the free parallel walls 2 at each end of the body together by their edges 3. Such terminal walls are then welded or otherwise suitably joined, thus forming a complete continuous side wall of the receptacle.

The flat or straight terminal portions 7 are thus formed into continuous flanges at each end and the flanged bottom 9 is then inserted within the receptacle and abutting the straight portion 7, and welded or otherwise secured in place.

It will be understood also that a top or cover for the vessel of any suitable form or construction may be secured to the upper annular flange of terminals 7, similar to the manner of attaching the bottom 9, and of any construction best adapted to the uses for which the vessel is designed.

The result of my invention is the provision of a radiating casing having a series of many elongated closely adjacent narrow deep pockets that will permit of expansion and contraction without injury. It gives a maximum cooling surface, allowing the air to enter between the circulating vanes at the bottom and escape undisturbed at the top. The casing may easily be made of sheet metal, thereby reducing the cost of manufacture to a minimum. The preferable method of welding the meeting edges 3 is by the oxy-acetylene flame or by electrical welding, although any other practicable method may be used.

It will be recognized that the invention is not necessarily limited to the specific type or design or proportions of the article shown and that it may also be utilized with good results and with other forms of mechanisms than that described, or be otherwise variously changed or modified by the mechanic skilled in the art within the scope of the appended claims, without departing from the spirit of my invention.

What I claim is:—

1. A sheet metal unit for a radiating casing comprising a back wall and integral side walls provided with terminal off-set securing edge portions extending in planes parallel to the planes of the side walls.

2. A sheet metal unit for a radiator casing having extended side portions joined by an intervening back and terminal end portions, the side and end portions having terminal flat edge portions off-set from but parallel to the general plane of the side portions and adapting the unit to welding connection with an adjacent similar unit.

3. A sheet metal unit for a radiator casing having extending side portions joined by an intervening back and terminal end portions, the side and end portions having laterally offset terminal flat edge portions substantially parallel to the planes of the side portions adapting the unit to welding connection with an adjacent similar unit, and to be bent into final form whereby the adjacent connected side portions form radiating pockets.

4. A unit for a radiating casing composed of a single piece of sheet metal and comprising a back wall, integral side walls having terminal edges off-set from said side walls and being parallel to the plane of the side portions, and flat end portions, said terminal edges and the sides of said end portions being on the same plane.

5. A radiating casing composed of a plurality of units formed of outwardly extending radiating members welded together, each of said units comprising a back wall, side walls having terminal edges off-set from said side walls, and flat end portions, said terminal edges and the sides of said end portions being on the same plane.

6. A radiating casing composed of a plurality of units, each of said units comprising a back wall, side walls, terminal edges off-set from said side walls, and flat end portions, said terminal edges and the sides of said end portions being on the same plane, said units having their terminal edges welded together and being bent to form the side walls of said casing, and a bottom secured thereto.

7. A radiating casing composed of a plurality of units, each of said units comprising a back wall, side walls, terminal edges off-set from said side walls, and flat end portions, said terminal edges and the sides of said end portions being on the same plane, said units having their terminal edges welded together to form continuous side walls of said casing having a plurality of hollow projecting radiating members therein, and a bottom inserted within said side walls and welded thereto.

8. A radiating casing composed of a plurality of units, each of said units comprising a back wall, parallel side walls having terminal edges off-set from said side walls, and flat end portions, said terminal edges and the sides of said end portions being on the same plane, said units having their terminal edges welded together to form continuous side walls of said casing providing a plurality of hollow projecting radiating members therein and having terminal flanges at each end, and a bottom welded to the inner faces of said flanges.

9. A radiating casing composed of a plurality of units, each of said units comprising a back wall, side walls, and terminal edges off-set from said side walls, said units having their terminal edges welded together and being bent to form the continuous side walls of said casing, and a bottom secured thereto.

10. A radiating casing comprising a sheet metal tank having a series of deep longitudinal radial extensions therefrom open to the tank throughout their lengths and closed at their ends, said tank being formed of a series of substantially U-shaped units welded together at longitudinal meeting edges.

11. A radiating casing comprising a sheet metal tank having a series of deep longitudinal radial extensions therefrom open to the tank throughout their lengths and closed at their ends, said tank being formed of a series of units welded together at longitudinal meeting edges, said units at their inner edges being provided with flat end projections forming, when the units are welded together, plane end portions of the tank.

12. A radiating casing comprising a sheet metal tank having a series of deep longitudinal radial extensions therefrom open to the tank throughout their lengths and closed at their ends, said tank being formed of a series of sheet metal units welded together at longitudinal meeting edges.

13. A radiating casing comprising a sheet metal tank having a series of deep longitudinal radial extensions therefrom open to the tank throughout their lengths and closed at their ends, said tank being formed of a series of sheet metal units welded together along longitudinal meeting edges at the outer sides of said longitudinal extensions.

14. A radiating casing comprising a sheet metal tank provided with longitudinal radial extensions open to the tank throughout their lengths, said casing being formed of a series of units welded together on longitudinal meeting edges, welded joints uniting two adjacent side walls of the radial extensions and closing the ends of said radial extensions.

15. A radiating casing comprising a sheet metal tank having smooth end portions, and between said end portions having radial extensions open to the tank and projecting outwardly beyond the smooth end portions and closed at their ends, whereby the exterior spaces between said extensions are open at their ends, said casing being formed of a series of units welded together on longitudinal meeting edges, welds extending along the exterior edges and across the ends of said radial extensions.

16. A radiating casing comprising a sheet metal tank having a series of deep longitudinal radial extensions therefrom open to the tank throughout their lengths and closed at their ends, said tank being formed of a series of units welded together at longitudinal meeting edges, a unit forming not to exceed a single radial extension.

17. A radiating casing comprising a sheet metal tank having smooth top and bottom portions and intermediate longitudinal radial extensions from the side walls, said extensions being open to the tank, said casing being formed of a series of units welded together on longitudinal meeting edges with joints located on the outer sides of said radial extensions.

CHARLES SONNEBORN.